US009379158B2

(12) United States Patent
Giffard et al.

(10) Patent No.: US 9,379,158 B2
(45) Date of Patent: Jun. 28, 2016

(54) OPTICAL DETECTOR UNIT

(71) Applicants: THALES, Neuilly sur Seine (FR); COMMISSARIAT A L'ENERGIE ATOMIQUE ET AUX ENERGIES ALTERNATIVES, Paris (FR)

(72) Inventors: Benoit Giffard, Grenoble (FR); Xavier Hugon, Teche (FR); Norbert Moussy, Saint Agnes (FR); Jean-Luc Reverchon, Palaiseau (FR); Philippe Bois, Palaiseau (FR)

(73) Assignees: THALES, Neuilly sur Seine (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/361,152

(22) PCT Filed: Nov. 29, 2012

(86) PCT No.: PCT/EP2012/073980
§ 371 (c)(1),
(2) Date: May 28, 2014

(87) PCT Pub. No.: WO2013/079603
PCT Pub. Date: Jun. 6, 2013

(65) Prior Publication Data
US 2014/0346356 A1 Nov. 27, 2014

(30) Foreign Application Priority Data

Nov. 29, 2011 (FR) .................................. 11 03630

(51) Int. Cl.
*G01J 5/00* (2006.01)
*H01L 27/146* (2006.01)
*H04N 5/32* (2006.01)
*H04N 5/378* (2011.01)

(52) U.S. Cl.
CPC ...... *H01L 27/14649* (2013.01); *H01L 27/1465* (2013.01); *H01L 27/1469* (2013.01);
(Continued)

(58) Field of Classification Search
CPC ............... H01L 27/14649; H01L 27/14641; H01L 27/14683; H04N 5/378
USPC ............................................ 250/338.1, 208.1
See application file for complete search history.

(56) References Cited

U.S. PATENT DOCUMENTS

2006/0043438 A1  3/2006 Holm et al.
2009/0121307 A1  5/2009 Tennant
(Continued)

FOREIGN PATENT DOCUMENTS

EP       2 267 776       12/2010

OTHER PUBLICATIONS

International Search Report dated Jan. 23 2013, from corresponding International Application No. PCT/EP2012/073980.

*Primary Examiner* — David Porta
*Assistant Examiner* — Meenakshi Sahu
(74) *Attorney, Agent, or Firm* — Troutman Sanders LLP

(57) ABSTRACT

This optical detector unit is a hybrid unit operating in a given wavelength range and includes, superposed, a first optical detector comprising detecting elements formed in a semiconductor structure, each detecting element being intended for converting a flux of incident photons into an electrical signal; and a first read out circuit, for reading the electrical signal from each detecting element. The optical detector unit furthermore has an imaging system with a second optical detector intended for increasing the operating wavelength range of the optical detector unit and a second read out circuit for reading the electrical signals from the detecting elements of the second optical detector.

The first and second read out circuit are integrated together, so as to form a common read out circuit.

9 Claims, 3 Drawing Sheets

(52) U.S. Cl.
CPC .... *H01L27/14634* (2013.01); *H01L 27/14636* (2013.01); *H01L 27/14641* (2013.01); *H01L 27/14652* (2013.01); *H01L 27/14683* (2013.01); *H04N 5/32* (2013.01); *H04N 5/378* (2013.01); *H01L 27/14647* (2013.01)

(56) References Cited

U.S. PATENT DOCUMENTS

2010/0320365 A1* 12/2010 Trezza et al. ............ 250/214 R
2011/0031401 A1    2/2011  Mitra et al.

\* cited by examiner

OPTICAL DETECTOR UNIT

CROSS-REFERENCE TO RELATED APPLICATIONS

This application claims priority to International Application No. PCT/EP2012/073980 filed on Nov. 29, 2012 which claims priority to French Patent Application No. 11 03630 dated Nov. 29, 2011. Further the International Application published on Jun. 6, 2013 as WO 2013/079603. All of the above referenced applications are incorporated by reference herein in their entirety.

FIELD OF THE INVENTION

The invention is concerned with the field of imaging based on photodiode matrix array, and more particularly relates to low light intensity imaging.

BACKGROUND

A known unit, for example from FIG. 1 of the document US 2011/0031401 is an optical detector unit that operates on front side illumination and in a range of infrared wave lengths, having an elementary infrared detector, or detecting element, formed in a HgCdTe (Mercury Cadmium Telluride) semiconductor structure and created in the form of an N—P junction photodiode. The infrared detector further also has a passivation layer located on both sides of the semiconductor structure. In operation, the infrared detector converts a flux of incident photons into an electrical signal.

According to a hybrid architecture, the optical detector unit also includes a read out circuit, also known as ROIC, the acronym for Read Out Integrated Circuit, assembled with the infra-red detector by means of an epoxy layer. The read out circuit, capable of processing the electrical signal emanating from the infrared detector has an electrode intended for receiving this electrical signal. This electrode is connected to the infra-red detector by means of an electrical contact formed in an electrical interconnection hole, also known as via, which passes through both the semiconductor structure as well as the dielectric passivation layer.

One advantage of this optical detector unit is that the establishment of the electrical contact in the electrical interconnection hole at the level of the infrared detector, and more specifically in contact with a doped zone N of the N—P junction photodiode, makes it possible to minimize the dark current generated in the photodiode.

However, this optical detector unit has a number of disadvantages.

In the first place, the operation of the optical detector unit is limited to the infrared spectrum. A known technique in order to extend the operation in the visible wavelengths of infrared detector units is to modify the structure of the infra-red detector, for example by removing the passivation layer located on the semi-conductor structure of the infrared detector. The problem is that this technique leads to changes in contrast with respect to the image generated at the output of the optical detector unit, which creates difficulties in interpretation and identification on this image.

In the second place, the resolution of an optical detector unit of the aforementioned type including a plurality of elementary detectors, for example, in the form of a matrix array, is limited. A conventional technique for increasing the resolution, that is to say, the number of elementary detectors, on a given surface is to reduce the width of the elementary detectors. This reduction leads to the closure of the electrical contacts, the electrical interconnection holes, and the N—P junctions between each elementary detector, which is a generator of cross talk between detectors. Also, this problem typically limits the width of an elementary detector to ten microns.

On the other hand, another drawback of the presence of the electrical interconnection hole opening on to the surface of the elementary detector, is that it limits the rate of filling of the elementary detector and therefore the sensitivity of the optical detector unit, with this fill rate being defined as the ratio between the surface of the elementary detector used for the detection of light and the total surface area of the elementary detector.

One object of the invention is therefore to provide an optical detector unit with a wide spectral range of operation, that is capable of multispectral detection, while at the same time offering improved performance as compared to the aforementioned state of the art.

SUMMARY

Thus the present invention relates to an optical detector unit, of the hybrid type, operating in a given wavelength range and having, in superposed manner, a first optical detector including detecting elements formed in a semiconductor structure, each detecting element being intended to convert a flux of incident photons into an electrical signal; and a first read out circuit, for reading the electrical signal from each detecting element.

The present invention also relates to a method for manufacturing an optical detector unit of the aforementioned type having of the following steps of providing a first optical detector, including detecting elements formed in a semiconductor structure, each detecting element being intended for converting a flux of incident photons into an electrical signal; and providing a first read out circuit, for reading the electrical signal from each detecting element.

Further to this end, the invention relates to an optical detector unit of the aforementioned type, where the optical detector unit, in addition, includes an imaging system that includes a second optical detector intended for increasing the range of operating wavelengths of the optical detector unit and a second read out circuit for reading the electrical signals from the detecting elements of the second optical detector, and in that the first read out circuit and the second read out circuit are integrated together, in a manner so as to form a common read out circuit.

The common read out circuit has electrodes connected one by one to the detecting elements of the first optical detector by means of a first electrical contact, and each first electrical contact is formed in an electrical interconnection hole (via) that passes through the semiconductor structure.

Each detecting element of the first optical detector includes a photodiode including a doped zone that is annular and extending in the semiconductor structure in a cylindrical manner around the electrical interconnection hole (via) (36) up to a predetermined depth.

According to other embodiments, the optical detector unit has one or more of the following characteristic features, taken in isolation or in accordance with any technically possible combination:
- the doped zone forms one portion of a P—N junction;
- the optical detector unit operates on back side illumination, and the imaging system and the window layer are transparent to the Infrared spectrum;
- the doped zone is obtained by diffusion or implantation;

the semiconductor structure includes of a window layer made of a first material, an absorption layer made of a second material, and a substrate made of a third material, and the semiconductor structure is a triplet {first material, second material, third material} of the group consisting of: "{InP, InGaAs, InP}, {GaSb, InAsSb, GaSb}, and {AlGaSb, InAsSb, GaSb}"; and the imaging system is sensitive to a wavelength range of between 0.4 micron and 1 micron, and the first optical detector is sensitive to a wavelength range of between 1 micron and 1.7 micron.

It further has a bonding assembly layer formed by molecular bonding and intended for assembling the first optical detector and the imaging system; and it further has at least one metal patch, disposed in contact with the semi-conductor structure and suitable for the optical confinement of the incident luminous flux in the semiconductor structure.

The object of the invention also relates to a method for producing an optical detector unit of the aforementioned type, characterized in that it has a step of providing an imaging system having a second optical detector intended for increasing the range of operating wavelengths of the optical detector unit and a second read out circuit for reading the electrical signals from the detecting elements of the second optical detector, and a step of integrating the first read out circuit and the second read out circuit, in a manner so as to form a common read out circuit having electrodes connected one by one to the detecting elements of the first optical detector by means of a first electrical contact, each first electrical contact being formed in an electrical interconnection hole passing through the semiconductor structure.

The step of providing the first optical detector includes the provision, for each detecting element of the first optical detector, of a photodiode including a doped zone that is annular and extending into the semiconductor structure in a cylindrical manner around the electrical interconnection hole up to a predetermined depth.

BRIEF DESCRIPTION OF THE DRAWINGS

These characteristic features and advantages of the invention will become apparent upon review of the description which follows, given purely by way of example intended to be non-limiting, and with reference being made to the accompanying drawings, in which.

For reasons of clarity, the figures and the parts of which they are composed have not been drawn to scale.

DETAILED DESCRIPTION

Figure 1:
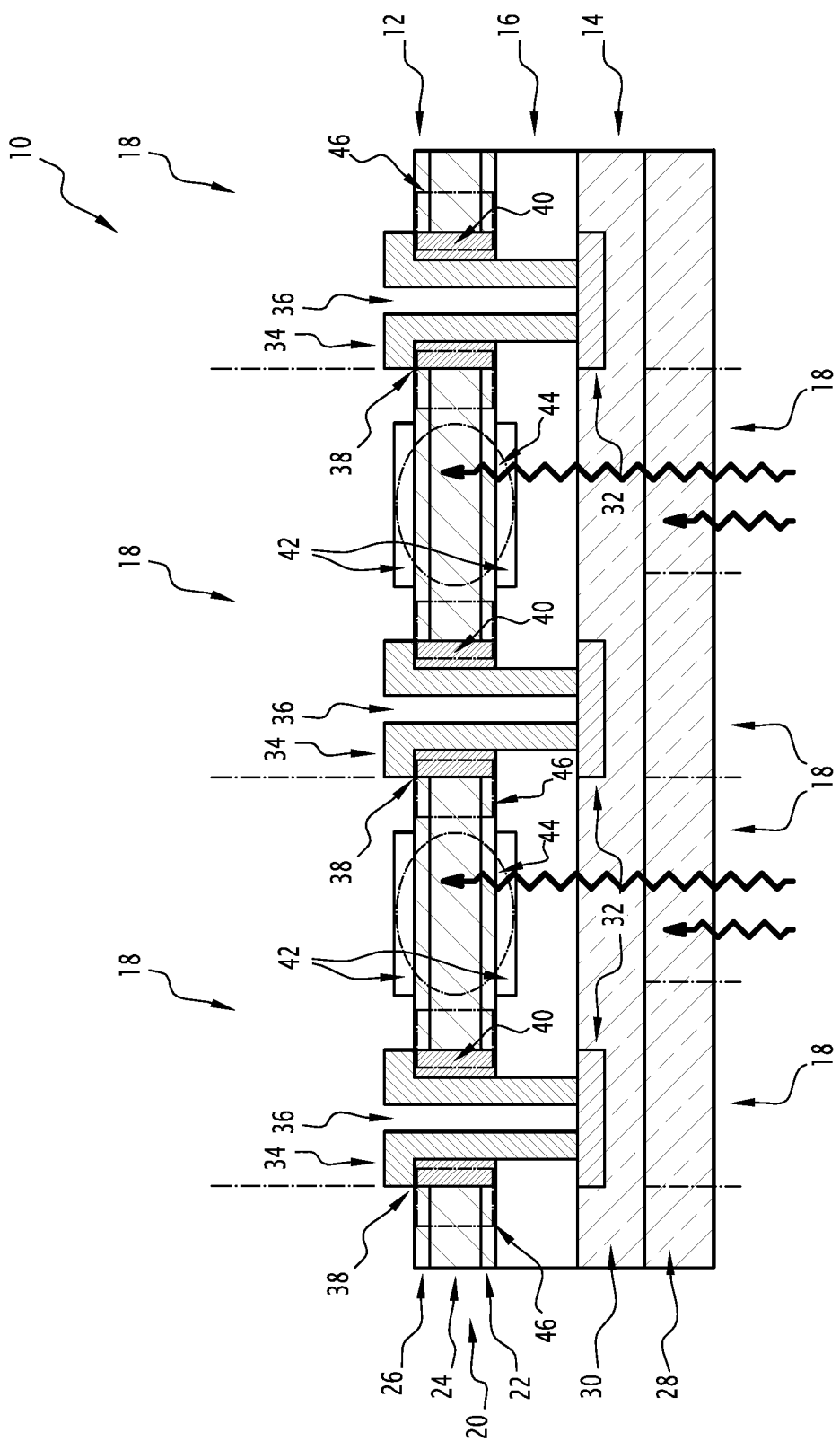
FIG. 1 is a schematic representation of a section of an optical detector unit according to the invention.
Figure 2:
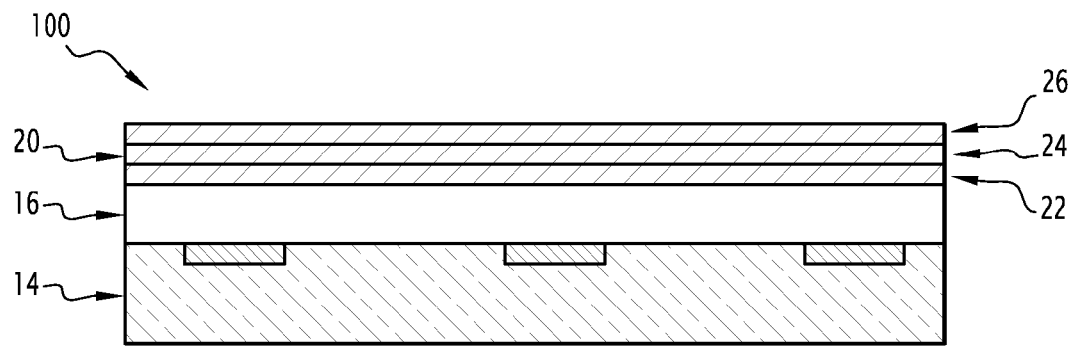
FIGS. 2 to 6 are sections of the optical detector unit illustrating the production process in conformity with the invention.

FIG. 1 shows an optical detector unit 10 operating in a given spectral range, for example in a range combining the visible and the infrared wavelength range of between 0.4 micron and 1.7 micron.

The optical detector unit 10 is based on a hybrid architecture using back side illumination, and has a first optical detector 12, like for example an infrared detector, assembled with an imaging system 14 by means of a bonding assembly layer 16.

The first optical detector 12 includes detecting elements 18, or pixels, arranged in the form of a matrix array and formed in a semiconductor structure 20 including a window layer 22, an absorption layer 24, and a substrate 26. Each detecting element 18, being of typical width equal to ten microns, is intended for converting an incident photon flux in the infrared range into an electrical signal.

In a general sense, the semiconductor structure 20 is preferably constituted from a base of materials in the III-V family.

The window layer 22, also known as barrier layer is, for example, of N type conductivity and made of InP (Indium Phosphide) material. By way of a variant, the material of the window layer 22 is GaSb (Gallium Antimonide), AlGaSb (Aluminum Gallium Antimonide) or AlAsSb (Aluminum Arsenide Antimonide).

The absorption layer 24 is, for example, of N type conductivity and made of InGaAs (Indium Gallium Arsenide) material. By way of a variant, the material of the absorption layer 24 is based on InAsSb (Indium Arsenide Antimonide), or InAs (Indium Arsenide) material.

The substrate 26 is for example made of InP (Indium Phosphide) material. By way of a variant, the substrate 26 is made of GaSb (Gallium Antimonide), or InAs (Indium Arsenide) material.

In the context of the use of the optical detector unit 10 with back side illumination, the window layer 22 is transparent to the infrared spectrum in the spectral range of operation.

In a preferable manner, the semiconductor structure 20 is an InP, InGaAs, InP assembly. By way of example, the semiconductor structure 20 has a thickness of 0.5 microns.

The imaging system 14 includes, on the one hand a second optical detector 28, for example sensitive in the visible spectrum, and on the other hand a common read out circuit 30, typically a multiplexer, associated with both the first optical detector 12 as well as the second optical detector 28.

The common read out circuit 30 functionally integrates, both a first read out circuit, conventionally associated with the first optical detector 12 and a second typical read out circuit for a CMOS imaging system, in order to be able to perform a reading of the detecting elements 18 of the first optical detector 12 and the detecting elements 18 of the second optical detector 28.

The imaging system 14, is, for example, a CMOS (acronym for Complementary Metal Oxide Semiconductor) imaging system, having of an assembly of detecting elements 18, or CMOS pixels of width equal to five microns, for example.

The common read out circuit 30 includes electrodes 32 intended for reading the electrical signal from each detecting element 18 of the first optical detector 12, each electrode 32 being directly connected one by one to the detecting elements 18 by means of a first electrical contact 34, or contact P, formed in an electrical interconnection hole (via) 36 passing through the semiconductor structure 20 and the bonding assembly layer 16. In a preferred manner, as illustrated in FIG. 1, the electrical interconnection hole 36 is vertical and has a typical depth of less than 1.5 microns.

In more precise fashion, each detecting element 18 has a photodiode 38 having a doped zone 40, for example, of P type conductivity, in a manner so as to form a portion of a P—N junction in the absorption layer 24. The doped zone 40 is annular and extends in the semiconductor structure 20 in a cylindrical manner around the electrical interconnection hole 36 up to a predetermined depth, for example of 0.1 micron. Preferably, as illustrated in FIG. 1, the doped zone 40 is formed uniformly around the electrical interconnection hole 36 in a manner so as to form a portion of a vertical P—N junction.

In preferred fashion, the optical detector unit 10 in addition includes at least one metal patch 42, that enables coupling to a plasmon and an associated second electrical contact in a manner so as to form a single element. The metal patch 42 is disposed in contact with the semiconductor structure 20 and associated with each detecting element 18.

The metal patch 42, also known as reflector or electromagnetic patch, is suitable for optical confinement 44 of the incident luminous flux in the semiconductor structure 20, in a manner so as to improve the absorption of incident infrared photons in the absorption layer 24. This enhancement of the absorption makes it possible to reduce the thickness of the absorption layer 24, which is suitable for bringing about a minimization of the dark current and the electrical capacitance of the photodiode 38.

The second electrical contact, or the contact N, associated with each photodiode 38, provides the ability to apply a potential at the level of the semiconductor structure 20 of N type conductivity of the photodiode 38, in a manner so as to bias the P—N junction.

Thus, the doped zone 40 constitutes a portion of a P—N junction, the other portion of which consists of the second electrical contact of opposite polarity and the absorption layer 24.

By way of a variant, the plasmon and the second electrical contact are dissociated in a manner so as to form two separate elements.

In another embodiment (not shown), micro lenses are arranged in contact with each detecting element 18, or CMOS pixel, of the imaging system 14 in a manner so as to improve the optical detection of the optical detector unit 10.

The operation of the optical detector unit 10 visible in FIG. 1 will now be described.

In one preferred embodiment, each photodiode 38 of the optical detector unit 10 is of PiN type, with photovoltaic mode of operation wherein a bias is applied at the level of the first electrical contact 34, and the metal patch 42 in a manner so as to generate an electric field E that enables the creating of a depletion zone 46, also called desertion zone. More specifically, the depletion zone 46, whose typical width is greater than 1.5 micron, is located around the cylindrical P—N junction, while also being rather localized outside of the doped zone 40 of P type conductivity.

During operation on back side illumination, an incident luminous flux in a wavelength range extending from the visible to infra-red spectrum, reaches the imaging system 14, that is to say, the CMOS imaging system, of the optical detector unit 10.

A part of the incident luminous flux in the form of photons of wavelengths in the visible and near infrared spectrum, typically between 0.4 micron and 1 micron, is detected by the detecting elements 18 of the second optical detector 28 which generate an electrical current, or photocurrent for each detecting element 18. Subsequently, the common read out circuit 30 receives, processes and routes the electrical current coming from each detecting element 18 to an external electronic device in order to create a first image in the visible spectrum.

A second part of the luminous flux in the form of photons of infrared wave length, typically between 1 micron and 1.7 microns, passes through the imaging system 14, the bonding assembly layer 16, and the window layer 22, these latter being transparent at the infra-red wave lengths from 1 to 1.7 microns.

Subsequently, the photons of infrared wave lengths reach the absorption layer 24 in which each photon creates an electron-hole pair which diffuses towards the depletion zone 46.

Under the effect of internal electric field E, the dissociation of the electron-hole pair takes place and the holes, with positive charge, are harvested by the first electrical contact 34 through the cylindrical P—N junction via the doped zone 40. At the level of each detecting element 18 of the first optical detector 12, all the charges collected thus generate an electrical current proportional to the light received, and more precisely proportional to the number of infrared photons received.

Subsequently, for each detecting element 18, the common read out circuit 30 receives the electric current via the electrode 32, and then processes and routes the electrical current to the external electronic device in order to create a second image in the infra-red spectrum.

Thus, the optical detector unit 10 according to the invention provides the ability to obtain both an infrared image and as well as a visible image, in a manner so as to enable multi-spectral detection. The visible image being obtained by a CMOS imaging system, the latter has a potentially very high resolution. Taking the example of a visible image obtained from pixels of five microns, and an infrared image obtained from pixels of ten microns, the resolution of the visible image is four times higher than that of the infrared image. Thus, the combination of the two images provides for improved processing of images in terms of interpretation and identification, and in particular with the enhanced identification of recognizable objects of interest, in certain cases, only on a type of image in a specific spectral range.

The method of manufacturing an optical detector unit 10 according to an example the invention shall now be described with the aid of FIGS. 2 to 6.

During a step 100, the process entails providing a semiconductor structure 20 including of a substrate 26 on which is formed by means of epitaxial growth, an absorption layer 24, for example consisting of InGaAs of N type conductivity. Subsequently, on the absorption layer 24, is then formed also by epitaxial growth a window layer 22, for example consisting of InP of N type conductivity, in a manner so as to obtain the semiconductor structure 20, shown in FIG. 2.

The component subsequently provided is an imaging system 14, such as a CMOS imaging system, to be then followed by the assembly, also known as hybridization, of the imaging system 14 with the semiconductor layer 12 by means of a bonding assembly layer 16.

Preferably, the assembly is carried out by "direct bonding" or "collage direct" in French, and more specifically by molecular bonding so as to obtain a bonding assembly layer 16 in the form of a molecular bonding dielectric. The molecular bonding dielectric is formed, right in the middle of the plate, at what are said to be low temperatures, typically between 200° C. and 400° C., generating a high surface energy by molecular adhesion.

Figure 3:
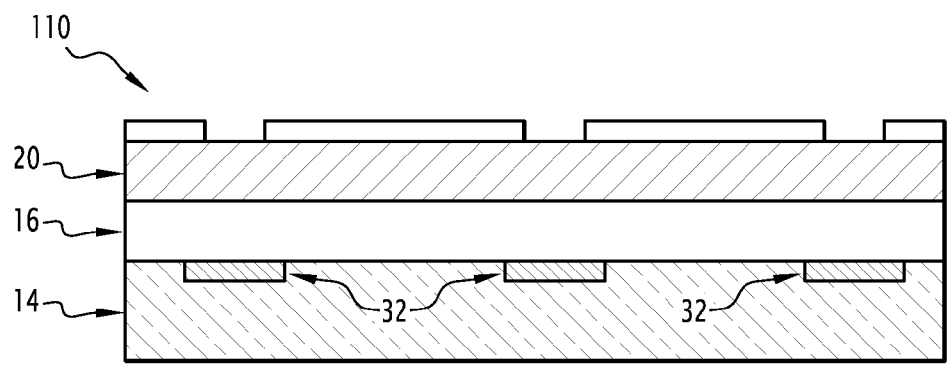

During a step 110, shown in FIG. 3, the process involves depositing a dielectric masking layer on the semiconductor structure 20. Thereafter, a chemical etching process is performed on a portion of the dielectric masking layer positioned facing the electrodes 32 of the imaging system 14.

Figure 4:
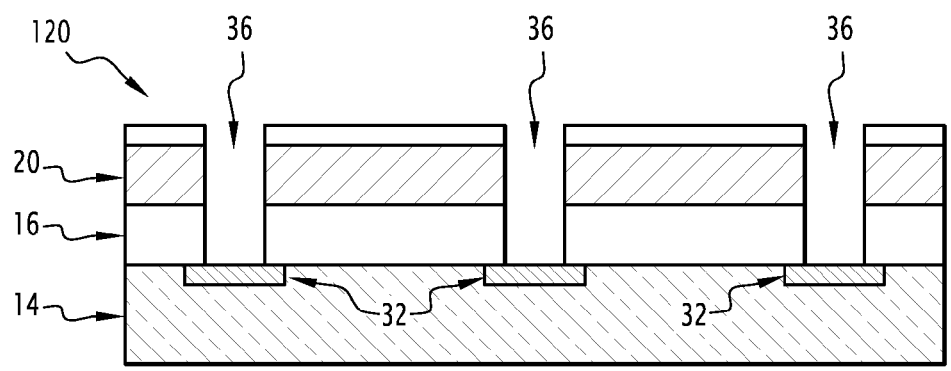

Then during a step 120 visible in FIG. 4, the process carried out is the etching of holes 36, extending in a substantially vertical manner to the electrodes 32, through the semiconductor structure 20 and the assembly layer 16. The etching is performed by way of a dry process or by chemical means.

Figure 5:
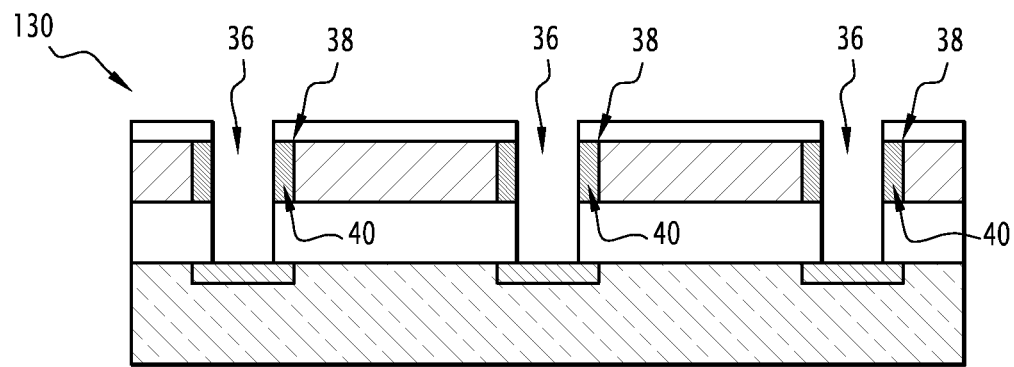
Figure 6:
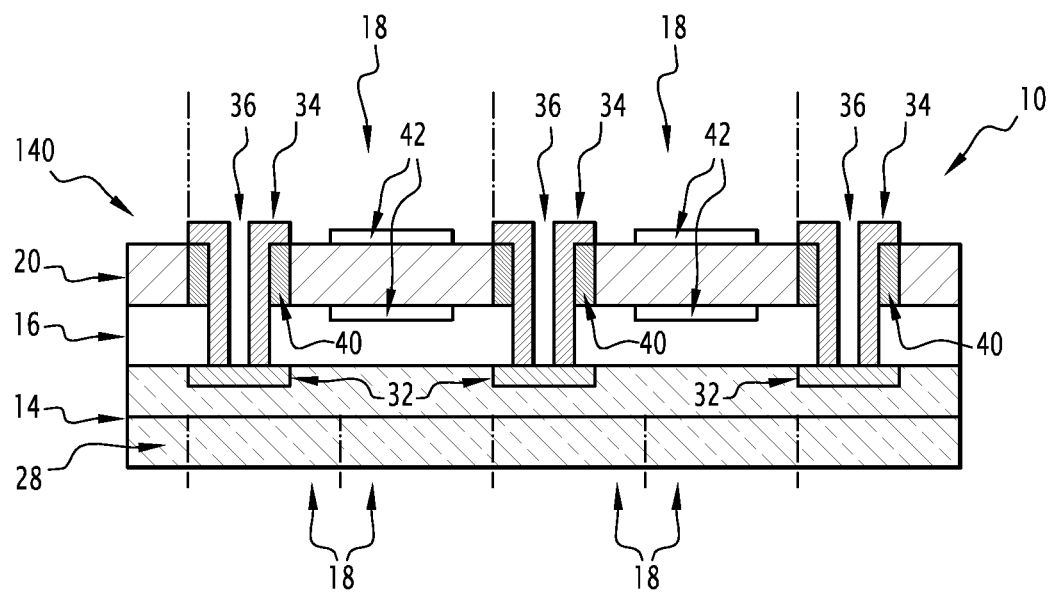

During a step 130, illustrated in FIG. 5, a doped zone 40, for example of P+ type conductivity, is created by means of diffusion or ion implantation through each hole 36, in a manner so as to form a photodiode 38 having a cylindrical P—N junction. Preferably, the doped zone 40 is obtained by Zinc diffusion.

Then, during a step 140, the process carried out involves on the one hand, the metallization of the first electrical contacts 34 in the holes 36 in a manner so as to place in electrical contact, the doped zone 40 and the electrode 32, and on the other hand, the metallization of two metal patches 42, associated with each photodiode 38, in contact above and below the semiconductor structure 20, as illustrated in FIG. 5.

Obtained upon completion of the step 140, is an optical detector unit 10 of the hybrid type according to the invention that has on an upper face an assembly of detecting elements 18 or pixels, which is preferably obtained in the form of a matrix array, and on a lower face, a matrix array of detecting elements 18, or CMOS pixels, of the CMOS imaging system.

Thus, the optical detector unit according to the invention, by means of an extension of the spectral range of operation, makes possible a multispectral detection capability suitable for inducing the improvement of performance in processing image, in particular in terms of recognition and identification.

Additionally, the operation on back side illumination of the optical detector unit in a general sense, also makes it possible to obtain a higher resolution and an improved fill rate.

Finally, the hybridization method used that combines the use of molecular bonding, with common read out circuit and plasmon patches provides the ability to obtain an optical detector unit at lower costs, and in compact sizes while also allowing for optimized performance.

The invention claimed is:

1. An optical detector unit, of hybrid type, operating in a given wavelength range and comprising, in superposed manner:
   a first optical detector, comprising detecting elements formed in a semiconductor structure, each detecting element converting a flux of incident photons into an electrical signal, and
   an imaging system comprising a second optical detector increasing the range of operating wavelengths of the optical detector unit, and
   a common readout circuit comprising a first read out circuit for reading the electrical signal from each detecting element and a second read out circuit reading the electrical signals from the detecting elements of the second optical detector, the first read out circuit and the second read out circuit being integrated together, in a manner so as to form the common read out circuit,
   the common read out circuit comprising electrodes connected one by one to the detecting elements of the first optical detector using a first electrical contact, each first electrical contact being formed in an electrical interconnection hole that passes through the semiconductor structure,
   wherein each detecting element of the first optical detector comprises a photodiode including a doped zone that is annular and extending in the semiconductor structure in a cylindrical manner around the electrical interconnection hole up to a predetermined depth.

2. The optical detector unit according to claim 1, wherein the doped zone forms one portion of a P—N junction.

3. The optical detector unit according to claim 1, wherein the optical detector unit operates on back side illumination, and in that the imaging system is transparent to/at the Infrared spectrum.

4. An optical detector unit according to claim 1, wherein the semiconductor structure comprises a window layer made of a first material, an absorption layer made of a second material, and a substrate made of a third material, and in that the semiconductor structure is a triplet {first material, second material, third material} of the group consisting of: {InP, InGaAs, InP}, {GaSb, InAsSb, GaSb}, and {AlGaSb, InAsSb, GaSb}.

5. The optical detector unit according to claim 4, wherein it operates on back side illumination, and in that the window layer is transparent to the Infrared spectrum.

6. The optical detector unit according to claim 1, wherein the imaging system is sensitive to a wavelength range of between 0.4 micron and 1 micron, and in that the first optical detector is sensitive to a wavelength range of between 1 micron and 1.7 micron.

7. The optical detector unit according to claim 1, further comprising a bonding assembly layer formed by molecular bonding to assemble the first optical detector and the imaging system.

8. The optical detector unit according to claim 1, further comprising at least a metal patch, disposed in contact with the semiconductor structure and suitable for the optical confinement of the incident luminous flux in the semiconductor structure.

9. A method of producing an optical detector unit according to any one of the preceding claims, comprising:
   a step providing a first optical detector, comprising detecting elements formed in a semiconductor structure, each detecting element converting a flux of incident photons into an electrical signal;
   a step providing a first read out circuit reading the electrical signal from each detecting element,
   a step providing an imaging system comprising a second optical detector increasing the range of operating wavelengths of the optical detector unit and a second read out circuit reading the electrical signals from the detecting elements of the second optical detector, and
   a step integrating the first read out circuit and the second read out circuit from a common read out circuit comprising of electrodes connected one by one to the detecting elements of the first optical detector by a first electrical contact, each first electrical contact formed in an electrical interconnection hole passing through the semiconductor structure,
   wherein the step for providing the first optical detector comprises the provision, for each detecting element of the first optical detector, a photodiode including a doped zone that is annular and extending into the semiconductor structure in a cylindrical manner around the electrical interconnection hole up to a predetermined depth.

* * * * *